(12) United States Patent
Behnke et al.

(10) Patent No.: US 12,716,128 B2
(45) Date of Patent: Aug. 25, 2026

(54) COATING INTERIOR SURFACES OF COMPLEX BODIES BY ATOMIC LAYER DEPOSITION

(71) Applicant: Applied Materials, Inc., Santa Clara, CA (US)

(72) Inventors: Joseph Frederick Behnke, San Jose, CA (US); Carlaton Wong, Sunnyvale, CA (US); Albert Barrett Hicks, III, Sunnyvale, CA (US); Steven Darrell Marcus, San Jose, CA (US); Joseph Frederick Sommers, Roseville, CA (US); Christopher Laurent Beaudry, San Jose, CA (US); Timothy Joseph Franklin, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 532 days.

(21) Appl. No.: 18/089,388

(22) Filed: Dec. 27, 2022

(65) Prior Publication Data

US 2023/0323531 A1 Oct. 12, 2023

Related U.S. Application Data

(60) Provisional application No. 63/328,194, filed on Apr. 6, 2022.

(51) Int. Cl.

| | |
|---|---|
| ***C23C 16/40*** | (2006.01) |
| ***C23C 16/455*** | (2006.01) |
| ***C23C 16/52*** | (2006.01) |

(52) U.S. Cl.
CPC ...... *C23C 16/403* (2013.01); *C23C 16/45544* (2013.01); *C23C 16/52* (2013.01)

(58) Field of Classification Search
CPC ............ C23C 16/45544; C23C 16/455; C23C 16/45565; C23C 16/45563
See application file for complete search history.

(56) References Cited

U.S. PATENT DOCUMENTS

2004/0123800 A1* 7/2004 Schlottmann ......... C23C 16/455 118/715
2015/0184296 A1 7/2015 Xu et al.
(Continued)

FOREIGN PATENT DOCUMENTS

| | | | |
|---|---|---|---|
| CN | 105986244 | B | 1/2019 |
| KR | 20150079483 | A | 7/2015 |
| WO | 2021045841 | A1 | 3/2021 |

OTHER PUBLICATIONS

International Search Report and Written Opinion for the International Application No. PCT/US2022/054187, mailed on May 4, 2023, 11 pages.

*Primary Examiner* — Joseph A Miller, Jr.
(74) *Attorney, Agent, or Firm* — Lowenstein Sandler LLP

(57) ABSTRACT

A method includes affixing a supply apparatus to inlets for one or more channels of a chamber component. The channels provide one or more gas flow paths between a first side of the chamber component that comprises the inlets and a second side of the chamber component comprising outlets of the one or more channels. The method further includes affixing an exhaust apparatus to the outlets of the one or more channels. The method further includes performing a plurality of atomic layer deposition cycles to deposit a corrosion resistant coating on interior surfaces of the one or more channels of the chamber component.

17 Claims, 6 Drawing Sheets

(56) References Cited

U.S. PATENT DOCUMENTS

2016/0375515 A1 12/2016 Xu et al.
2019/0100842 A1 4/2019 Hendrix et al.

* cited by examiner 100
106
108
140
142
144
146
120
110
112
102
136
122
126
116
118
114
124
134
128
104
130
132

COATING INTERIOR SURFACES OF COMPLEX BODIES BY ATOMIC LAYER DEPOSITION

RELATED APPLICATIONS

This patent application claims the benefit under 35 U.S.C. § 119(e) of U.S. Provisional Application No. 63/328,194, filed Apr. 6, 2022.

TECHNICAL FIELD

The present disclosure relates to methods associated with atomic layer deposition. More particularly, the present disclosure relates to systems and methods for generating a corrosion resistant coating on internal surfaces of components with complex internal structure and/or high aspect ratios by atomic layer deposition.

BACKGROUND

Products may be produced by performing one or more manufacturing processes using manufacturing equipment. For example, semiconductor manufacturing equipment may be used to produce substrates via semiconductor manufacturing processes. In some embodiments, conditions used for processing semiconductors may be harsh, e.g., processing may be performed at high temperatures, include plasma, involve corrosive gases, etc. To avoid excessive maintenance and/or component replacement, processing chamber components may be constructed in such a way as to resist detrimental effects of target processing conditions.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular embodiments of the disclosure or any scope of the claims. Its sole purpose is to present some concepts of the disclosure in a simplified form as a prelude to the more detailed description that is presented later.

One aspect of the disclosure describes a method including affixing a supply apparatus to inlets for one or more channels of a chamber component. The channels provide one or more gas flow paths between a first side of the chamber component that comprises the inlets and a second side of the chamber component comprising outlets of the one or more channels. The method further includes affixing an exhaust apparatus to the outlets of the one or more channels. The method further includes performing a plurality of atomic layer deposition (ALD) cycles to deposit a corrosion resistant coating on interior surfaces of the one or more channels of the chamber component. Performing an ALD cycle of the plurality of ALD cycles includes delivering a first reactant from the supply apparatus through the one or more channels to cause the first reactant to adsorb onto the interior surface of the one or more channels. Performing an ALD cycle further includes evacuating the first reactant from the one or more channels through the exhaust apparatus. Performing an ALD cycle further includes delivering a second reactant from the supply apparatus through the one or more channels to cause the second reactant to react with the first reactant adsorbed onto the interior surface of the one or more channels. Performing an ALD cycle further includes evacuating the second reactant.

In another aspect of the present disclosure, a system includes a processing chamber component. The system also includes an ALD gas supply apparatus. The supply apparatus is affixed to inlets for one or more channels of the processing chamber component. The one or more channels provide one or more fluid flow paths between a first side of the chamber component that comprises the inlets and a second side of the processing chamber component comprising outlets of the one or more channels. The system further includes an exhaust apparatus. The exhaust apparatus is coupled to the outlets of the one or more channels. The processing chamber component, the supply apparatus, and the exhaust apparatus define an ALD flow path.

In another aspect of the disclosure, a component of a processing chamber includes a first side, which includes inlets. The component includes a second side, which includes outlets. The component further includes one or more channels between the inlets and the outlets. The channels provide one or more fluid flow paths between the first side and the second side. The component further includes a corrosion resistant coating deposited on one or more surfaces adjacent to the channels.

BRIEF DESCRIPTION OF THE DRAWINGS

The present disclosure is illustrated by way of example, and not by way of limitation in the figures of the accompanying drawings.

DETAILED DESCRIPTION

Figure 1:
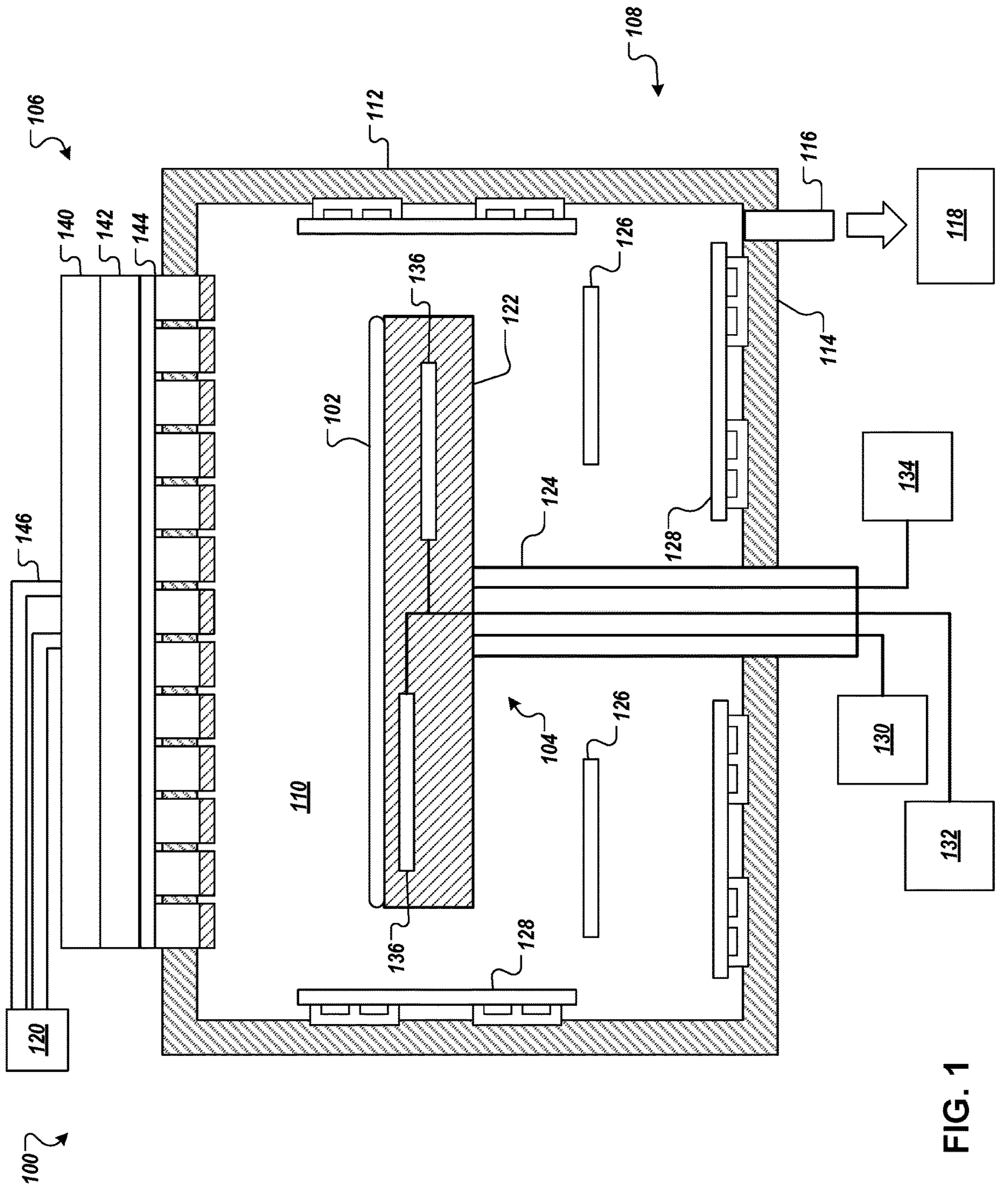
FIG. 1 depicts a sectional view of a processing chamber, according to some embodiments.

Described herein are technologies related to generating a resistant coating (e.g., a corrosion resistant coating, a halogen resistant coating, etc.) on surfaces of components with complex interior geometries. Components with complex interior geometries include components with multiple interior channels, e.g., defining fluid flow paths, components with multiple interior volumes, components with a large amount of interior surface area compared to the area through which gas can access interior volumes (e.g., cross sectional area of an interior volume at a surface of the component), etc.

Manufacturing equipment is used to produce products, such as substrates (e.g., wafers, semiconductors). Manufacturing equipment may include a processing chamber to separate the substrate from the environment. The properties of processed substrates are to meet target values to facilitate specific functionalities. Manufacturing/processing parameters are selected to produce substrates that meet the target property values. Components of processing equipment may be configured to generate the target parameters during processing. For example, a substrate may be exposed to a corrosive gas, e.g., during an etch process operation. A gas delivery system may be configured to achieve a uniform condition across the surface of the substrate, e.g., a gas delivery system may include a component (such as a showerhead) that disperses gas from a large number of gas outlets (e.g., hundreds of outlets, in some embodiments) to generate uniform conditions in the processing chamber. As a further example, temperature of a process may be controlled. Components of a processing chamber may be configured to effectively transfer heat, e.g., by choosing construction material with high thermal conductivity, by designing components such that interfaces between bodies transfer heat effectively, etc.

In some processes, conditions may be used that may be harmful to some components, e.g., high temperatures may age, melt, or damage certain materials, corrosive gases or plasma may degrade certain materials, etc. In some systems, components may be coated to provide protection from harmful conditions. For example, aluminum quickly degrades in the presence of halogen-containing gas. In some systems, aluminum components may be coated in a resistant material (e.g., corrosion resistant, halogen resistant, etc.) such as alumina ($Al_2O_3$). In some systems, this may retain valuable properties of aluminum and additionally provide resistance to harmful processing conditions.

Thin protective coatings may be applied using a variety of methods. Examples include physical vapor deposition, chemical vapor deposition, atomic layer deposition, electroplating, etc. Various methods have associated disadvantages. Physical vapor deposition techniques (e.g., sputtering, pulsed laser deposition, etc.) are often limited to or most effective in line-of-sight procedures, and may be ineffective at coating an interior volume. Chemical vapor deposition may generate uneven coating depths on components with various portions that have varied availability to the reactive gases. Atomic Layer Deposition (ALD) techniques conventionally involve flooding a chamber containing the target component, allowing diffusion to drive thorough deposition of material. Particularly convoluted components, e.g., components with large internal volumes compared to the size of channels allowing access to them, components with large internal surface areas to be coated compared to the cross sectional surface area through which gas can flow to reach the target surfaces, etc., may take a prohibitively long time to coat utilizing a conventional ALD technique. Electroplating similarly is constrained by areas of a component surface that electric current can be effectively driven through. Geometrically complex components may distribute charge unevenly, generating an uneven coating, leaving some portions of the component uncoated, etc.

In some systems, a single component may be made of multiple bodies bonded together (e.g., via braising, via diffusion bonding, etc.). A protective coating may be applied to bodies before bonding. In some embodiments, the protective coating may introduce undesirable properties to the assembled component. For example, in some embodiments, a component may be utilized for temperature control of a process (e.g., of a process gas). A protective layer disposed between bodies of the component may hinder heat conductivity through the component, and hinder temperature control of the process. Additionally, the bonding process may impede the performance of the protective coating. For example, braising and diffusion bonding may include high temperature processing to generate the bond between bodies of the component. The protective coating may be damaged, may become mobile, etc., at the temperatures used for generating these bonds.

Systems and methods of this disclosure may address one or more of these deficiencies of conventional systems. In some embodiments, a chamber component including a complex interior structure is to have a protective coating applied. Herein, "complex interior structure" may be understood to indicate a body with an internal structure not easily accessible to gas via diffusion, e.g., a high ratio between internal volume and volume gas flux may flow through to access the internal volume, etc.

In some embodiments, the component to be coated may be a component of a processing chamber. In some embodiments, the component to be coated may be a component of a gas delivery system of a processing chamber. In some embodiments, the component to be coated may include a plurality of internal fluid flow paths, e.g., a large number of channels through which process gas is to flow during processing. In some embodiments, a chamber component may include hundreds of gas paths. Surfaces adjacent to fluid flow paths may be coated to protect the component, e.g., from corrosive gas.

A pressure differential may be generated, in accordance with embodiments of this disclosure, to drive the flow of coating gases of an ALD process through the fluid flow channels of the chamber component. ALD methods deposit an even layer upon the surface of a component, as a single application of a coating precursor generates a single layer of occupied available sites on the surface. The precursor gas is then replaced with a second precursor gas, which also generates a single layer by occupying available surface sites by bonding to the first precursor. Layers are continually built up in this way to generate a coating of a target thickness.

In some embodiments of the present disclosure, a supply apparatus and an exhaust apparatus are provided. The supply apparatus and exhaust apparatus are coupled to opposite sides of one or more fluid flow paths through the chamber component. A pressure differential may be generated by utilizing a pumping system coupled to the exhaust apparatus. The supply apparatus may provide one or more gases including ALD precursors. The pressure differential may drive the ALD precursors through the chamber component, e.g., may generate bonding or adsorption between ALD precursors and target surfaces of the chamber component more quickly than diffusion. In some embodiments, generating a protective coating using ALD may involve many cycles of supplying a precursor and evacuating the precursor. In some embodiments, thousands of cycles may be used to generate a coating. Even in systems where diffusion of ALD precursors to all surfaces may occur in a relatively short time, e.g., minutes, generating a coating of a target thickness may take a prohibitively long time. Increasing the rate at which ALD precursors are supplied to target surfaces and evacuated from interior volume of a component may greatly increase throughput and decrease expense of coating a component.

Aspects of the present disclosure result in technological advantages compared to conventional solutions. Aspects of the present disclosure enable coating via ALD techniques of interior surfaces of components with complex internal structure (e.g., of interior channels of an upper electrode heater/chiller stack of a chamber such as an etch chamber). ALD allows for generation of a coating of uniform thickness. Aspects of the present disclosure enable coating components manufactured from multiple bodies after assembly of the component, which may preserve desirable characteristics of the component. Aspects of the present disclosure enable coating components manufactured from multiple bodies after bonding of the bodies, which may preserve desirable characteristics of the coating.

One aspect of the disclosure describes a method including affixing a supply apparatus to inlets for one or more channels of a chamber component. The channels provide one or more gas flow paths between a first side of the chamber component that comprises the inlets and a second side of the chamber component comprising outlets of the one or more channels. The method further includes affixing an exhaust apparatus to the outlets of the one or more channels. The method further includes performing a plurality of atomic layer deposition (ALD) cycles to deposit a corrosion resistant coating on interior surfaces of the one or more channels of the chamber component. Performing an ALD cycle of the plurality of ALD cycles includes delivering a first reactant from the supply apparatus through the one or more channels to cause the first reactant to adsorb onto the interior surface of the one or more channels. Performing an ALD cycle further includes evacuating the first reactant from the one or more channels through the exhaust apparatus. Performing an ALD cycle further includes delivering a second reactant from the supply apparatus through the one or more channels to cause the second reactant to react with the first reactant adsorbed onto the interior surface of the one or more channels. Performing an ALD cycle further includes evacuating the second reactant.

In another aspect of the present disclosure, a system includes a processing chamber component. The system also includes an ALD gas supply apparatus. The supply apparatus is affixed to inlets for one or more channels of the processing chamber component. The one or more channels provide one or more fluid flow paths between a first side of the chamber component that comprises the inlets and a second side of the processing chamber component comprising outlets of the one or more channels. The system further includes an exhaust apparatus. The exhaust apparatus is coupled to the outlets of the one or more channels. The processing chamber component, the supply apparatus, and the exhaust apparatus define an ALD flow path.

In another aspect of the disclosure, a component of a processing chamber includes a first side, which includes inlets. The component includes a second side, which includes outlets. The component further includes one or more channels between the inlets and the outlets. The channels provide one or more fluid flow paths between the first side and the second side. The component further includes a corrosion resistant coating deposited on one or more surfaces adjacent to the channels.

FIG. 1 depicts a sectional view of a processing chamber 100 (e.g., a semiconductor wafer manufacturing chamber), according to some embodiments. Processing chamber 100 may be one or more of an etch chamber, deposition chamber (including atomic layer deposition, chemical vapor deposition, physical vapor deposition, plasma enhanced versions thereof, etc.), anneal chamber, or the like. For example, processing chamber 100 may be a chamber for a plasma etcher, a plasma cleaner, and so forth. Examples of chamber components may include a substrate support 104, a chuck (e.g., electrostatic chuck, vacuum chuck, etc.), a ring (e.g., a process kit ring), a chamber wall, a base, gas delivery system 106 (e.g., including gas panel 120, chill plate 140, heat plate 142, showerhead assembly 144, gas inlet lines 146, etc.), a liner, a liner kit, a shield, a plasma screen, a flow equalizer, a chamber viewport, a chamber lid, a nozzle, and so on.

In some embodiments, processing chamber 100 includes a chamber body 108 and a showerhead assembly 144 that enclose an interior volume 110. In some chambers, portions of gas delivery system 106 (e.g., showerhead assembly 144) may be replaced by a lid and nozzle. Chamber body 108 may be constructed from aluminum, stainless steel, or other suitable material. Chamber body 108 generally includes sidewalls 112 and bottom 114.

An exhaust port 116 may be defined in chamber body 108, and may couple interior volume 110 to a pump system 118. Pump system 118 may include one or more pumps and valves utilized to evacuate and regulate the pressure of interior volume 110 of processing chamber 100. Pump system 118 may include one or more gauges to monitor pressure.

Portions of gas delivery system 106 (e.g., showerhead assembly 144, chill plate 140, heat plate 142, etc.) may be supported on sidewalls 112 of chamber body 108 or on a top portion of the chamber body. Portions of gas delivery system 106 (or a lid, in some embodiments) may be opened to allow access to interior volume 110 of processing chamber 100, and may provide a seal for processing chamber 100 while closed. Gas panel 120 may be coupled to processing chamber 100 to provide process or cleaning gases to interior volume 110 through other components of gas delivery system 106 (or through a lid and nozzle assembly, etc.). As depicted in FIG. 1, a seal is generated between chamber body 108 and showerhead assembly 144, though in other embodiments a seal defining interior volume 110 may be made between different components (e.g., between chamber body 108 and chill plate 140, between chamber body 108 and heat plate 142, etc.). Showerhead assembly 144 may include multiple gas delivery holes, e.g., include multiple inlet holes each coupled to an outlet hole to direct gas from gas panel 120 to interior volume 110.

In some embodiments, gas panel 120 may have a number of gas outlets coupled to gas inlet lines 146 (e.g., of a heater/chiller stack comprising heat plate 142 and chill plate 140). The heat plate 142 and chill plate 140 may be bonded together by a high thermal conductivity bond, and in embodiments are both composed of a high thermal conductivity material such as aluminum or an aluminum alloy. In some embodiments, gas delivery system 106 may include branching gas flow pathways, e.g., gas flow paths may diverge within chill plate 140, heat plate 142, showerhead assembly 144, etc., to generate more outlet ports into processing chamber 100 than gas inlet lines 146. In one embodiments, gas panel 120 may provide gas to a number of inlets (e.g., two inlets, three inlets, four inlets, etc.) which branch to provide gas to interior volume 110 via a plurality of delivery holes (e.g., hundreds of delivery holes). Gas inlet lines may be coupled to inlets of one or more components of gas delivery system 106. Each inlet may be coupled to a region of delivery holes (e.g., in an annular pattern, a radial pattern, a segmented pattern, etc.), may be coupled to all delivery holes, may be configured to provide different gases (e.g., process gas, carrier gas, inert gas, etc.), or the like. Examples of processing gases that may be used to process substrates in processing chamber 100 include halogen-containing gases, such as $C_2F_6$, $SF_6$, $SiCl_4$, HBr, $NF_3$, $CF_4$, $CHF_3$, $F_2$, $Cl_2$, $CCl_4$, $BCl_3$, and $SiF_4$, among others, and other gases such as $O_2$ or $N_2O$. Examples of carrier gases include $N_2$, He, Ar, and other gases inert to process gases (e.g., non-reactive gases).

In some embodiments, components of gas delivery system 106 (e.g., chill plate 140, heat plate 142, etc.) may provide temperature control to one or more process gases. In some embodiments, efficiency of gas temperature control (e.g., energy efficiency, time efficiency, etc.), is impacted by thermal conductivity of components of gas delivery system 106. In some embodiments, material used to construct components of gas delivery system 106 may be chosen to exhibit high thermal conductivity, e.g., aluminum.

In some embodiments, process gases may include corrosive gases, e.g., halogen-containing gases. Corrosive gases may react with components of gas delivery system 106. Materials used to construct components of gas delivery system may be chosen to exhibit resistance to process gases, e.g., stainless steel. In some embodiments, materials exhibiting high thermal conductivity (and/or other target properties, such as density, conductivity, strength, etc.) may not exhibit high resistance to process gas, such as halogen-containing gas (e.g., aluminum). In some embodiments, selective deposition of corrosion-resistant material (e.g., alumina) may preserve material integrity and thermal conductivity of one or more components of gas delivery system 106. For example, depositing alumina on surfaces (e.g., interior surfaces of channels) of chill plate 140 and/or heat plate 142 proximate to or within fluid flow paths may provide a protective coating isolating the components from corrosive and/or reactive process gases. In some embodiments, deposition of resistant coating material (e.g., alumina) may not be performed in regions of the surface of a component that does not contact process gas. For example, one or more components of gas delivery system (e.g., chill plate 140) may be constructed of multiple bodies bonded together (e.g., by braising, diffusion bonding, etc.). Interfaces between bodies of the component may be kept free of resistant coating to maintain thermal conductivity of the component.

In some embodiments, surfaces of components of gas delivery system 106 may be coated with a resistant coating using atomic layer deposition (ALD) methods. In a typical ALD system, a chamber containing a component to be coated is sequentially flooded with various reactive materials (e.g., coating precursors) and evacuated. In some embodiments, such an approach may be unfeasible, e.g., for components with a complex internal structure to which a coating is to be applied.

As an example, in some embodiments chill plate 140 may include a number of gas inlets and a number of gas outlets. In some embodiments, a the gas inlets are coupled to the outlets via a number of channels through chill plate 140, the channels defining one or more fluid flow paths. In some embodiments, for example when chill plate 140 is to supply gas to a showerhead of a processing chamber, fluid flow paths through the chill plate may include a high degree of branching, turning, etc., for example, each inlet may branch into hundreds of outlets. In some embodiments, flooding of internal volumes of chill plate 140 (e.g., relying on diffusion or effusion) may be prohibitively slow, e.g., if a ratio between surface area defining a possible diffusive or effusive gas path to an inner volume and the volume to be filled (or length of the channel to be coated) is low. For example, in systems with straight features with aspect ratios of about 25:1 and above, conventional ALD techniques may be unsuitable. ALD may fail at lower aspect ratios, for example with more complex features (e.g., tortuous paths). Conventional ALD techniques may fail to accumulate sufficient concentration of species for forming the coating (e.g., coating precursors) in the course of a normal processing time (e.g., seconds to minutes). In some embodiments, ALD coating may include repeating flooding and evacuation processes many times to build up a coating of a target thickness, e.g., thousands of times. Systems and components in which diffusion is slow to reach target areas may take a prohibitively long time to coat effectively. In some embodiments, utilizing a pressure differential across a fluid flow path to be coated may increase the rate at which a precursor gas, process gas, purge gas, or the like is disposed in or removed from an inner volume of the chamber component, compared to the rate of diffusion. Systems and methods of coating a component with a complex inner volume are discussed further in connection with FIGS. 2-5.

Substrate support 104 is disposed in interior volume 110 of processing chamber 100 below showerhead assembly 144. In some embodiments, substrate support 104 includes susceptor 122 and shaft 124. Substrate support 104 supports a substrate 102 during processing. In some embodiments, also disposed within processing chamber 100 are one or more heaters 126 and reflectors 128.

Substrate support 104 may include electronics providing power and control to electrodes disposed within substrate support 104. Substrate support 104 depicted in FIG. 1 includes an electrostatic chuck assembly, substrate supports including other components are possible and within the scope of this disclosure. Substrate support 104 may include one or more clamping electrodes (not shown). Clamping electrodes may be controlled by chucking power source 130. Chucking power source 130 may include separate outputs to each clamping electrode, to enable separate control of clamping electrodes. Only one output of chucking power source 130 (and other similarly positioned components) is shown in FIG. 1 for clarity.

Substrate support 104 may include one or more heating elements 136 disposed within the support (e.g., substrate support 104 may include an electrostatic chuck heater assembly). Embedded heating elements may be regulated by a heater power source 132. Heater power source 132 may have many of the same features as chucking power source 130. Substrate support 104 may further include one or more radio frequency (RF) elements, controlled by RF output generator 134. RF output generator 134 and RF elements may have some features in common with chucking and heating systems of substrate support 104.

Figure 2:
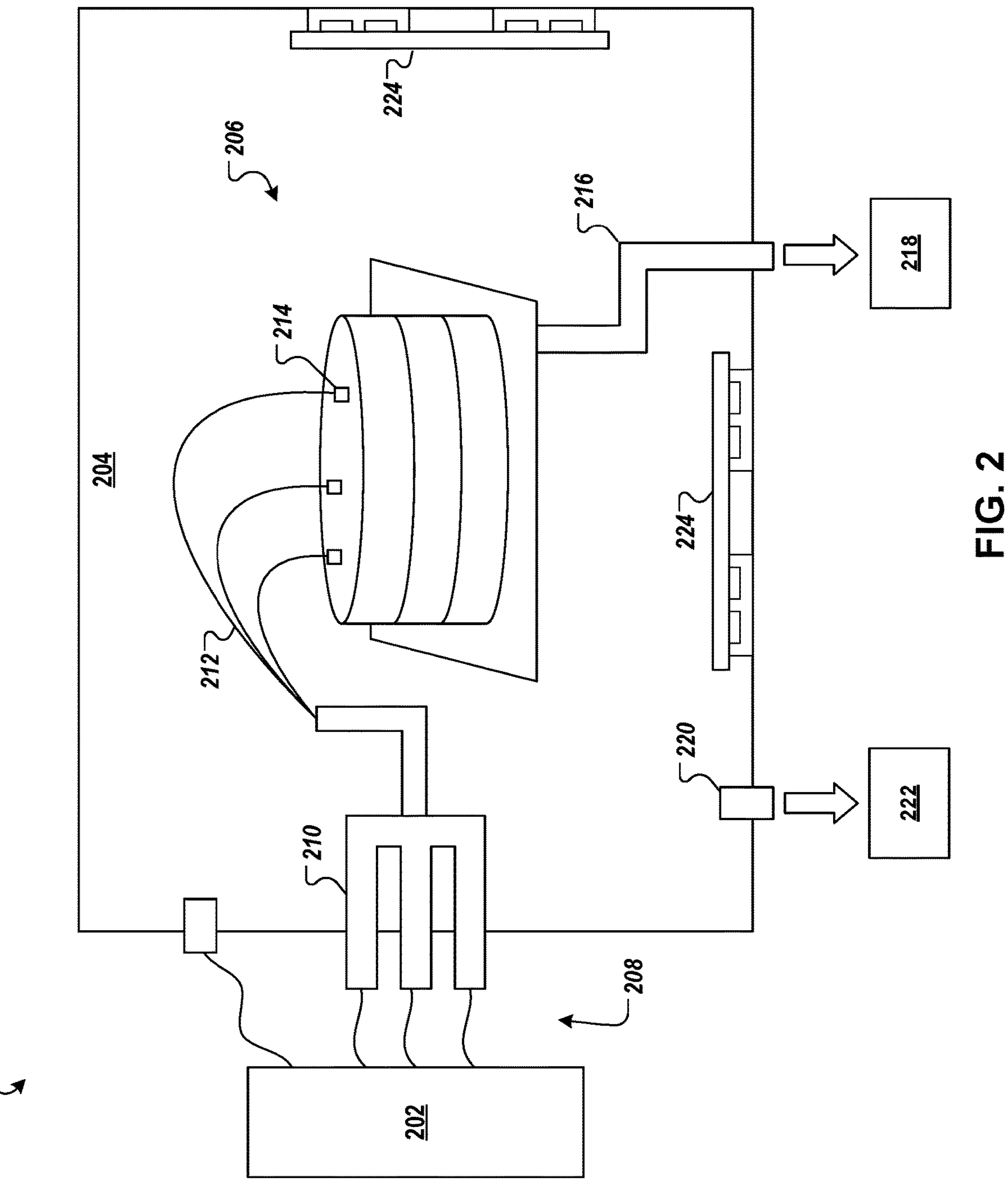
FIG. 2 depicts an exemplary system for coating a surface of a processing chamber component, according to some embodiments.

FIG. 2 depicts an exemplary system 200 for coating a surface of a processing chamber component, according to some embodiments. System 200 includes gas panel 202, outer chamber 204, and inner chamber 206. Gas panel 202 is coupled to inner chamber 206 and/or outer chamber 204 via lines 208. Lines 208 may connect to gas manifold 210. Gas manifold 210 may include lines, valves, branches, vessels, gauges, etc., configured for conveying, mixing, supplying, monitoring, etc., gases to inner chamber 206 and/or outer chamber 204. In some embodiments, gas manifold 210 may be disposed inside outer chamber 204, partially inside outer chamber 204, outside outer chamber 204, etc. Gas manifold 210 may be configured to supply one gas mix to multiple outlets, separate gas mixes to separate outlets, etc. In some embodiments, gas panel 202 may be coupled to outer chamber 204 by a line 208 (e.g., to supply an inert gas, a purge gas, etc.). In some embodiments, gas may be supplied to outer chamber 204 via gas manifold 210.

Gas manifold 210 supplies gases to inner lines 212. Inner lines 212 are coupled to one or more inlets 214 of inner chamber 206. In some embodiments, inner chamber 206 includes the processing chamber component(s) to be coated, e.g., the inner volume of inner chamber 206 may be defined (in part) by the processing chamber components to be coated. In some embodiments, inner chamber 206 may include one or more chamber components to be coated, and one or more apparatuses configured to isolate the inner volume of inner chamber 206 (e.g., as depicted in FIG. 2, stacked cylinders and the lower plate of inner chamber 206 may include one or more chamber components to be coated, and one or more apparatuses configured to isolate the inner volume of inner chamber 206 from the inner volume of outer chamber 204). In some embodiments, one or more seals may be generated between components of inner chamber 206, e.g., O-ring seals, gravity seals, etc., which isolate the volume inside inner chamber 206 from the volume inside outer chamber 204.

Inner chamber 206 may be coupled to inner chamber exhaust system 216. Inner chamber exhaust system may be coupled to inner chamber exhaust pumping system 218. Pumping system 218 may include one or more pumps, valves, lines, gauges, etc., configured to evacuate gas from inner chamber 206. Outer chamber 204 may similarly be coupled to outer chamber exhaust system 220 and/or outer chamber pumping system 222. Outer chamber exhaust system 220 and/or outer chamber pumping system 222 may share features with inner chamber exhaust system 216 and/or inner chamber pumping system 218. In some embodiments, inner chamber and outer chamber system may share one or more components, e.g., pumps, lines, valves, vessels, etc.

System 200 may be utilized for coating one or more surfaces of one or more processing chamber components with a resistant coating (e.g., a halogen resistant coating) using ALD. System 200 may supply gas (e.g., coating precursors in a carrier gas) to surfaces to be coated via gas manifold 210, lines 212, etc. System 200 may evacuate supply gas from volumes proximate to surfaces being coated via inner chamber exhaust system 216. Another process gas may then be introduced to inner chamber 206. Repeated flow of one or more process gases builds up a layer on exposed surfaces (e.g., inner surfaces, inner channels, fluid flow paths, etc.). The coating process may be repeated until a target thickness is reached. In some embodiments, outer chamber 204 may be supplied with a gas by gas panel 202 (e.g., an inert gas). In some embodiments, pressure of gas in outer chamber 204 may be controlled to reduce the effect of imperfect seals between inner chamber 206 and outer chamber 204, e.g., outer chamber 204 may be kept at a higher pressure than inner chamber 206 to reduce process gas (e.g., reactive gas, coating precursors, etc.) from exiting inner chamber 206 to outer chamber 204. In some embodiments, pressure of ALD gas in the inner chamber 206 may be maintained between 200 millitorr and 20 torr, between 1 torr and 15 torr, about 10 torr, or the like. In some embodiments, outer chamber 204 may be maintained at higher pressure, e.g., about ½ torr higher than inner chamber 206, about 1 torr higher, about 5 torr higher, or the like.

In some embodiments, outer chamber 204 may include further features, such as heating elements 224. Heating elements 224 may be used to control the temperature of inner chamber 206, gas supply, etc., during coating procedures. In some embodiments, ALD may proceed faster (e.g., faster reaction speed) at high temperatures (e.g., about 300° C.). In some embodiments, one or more components of system 200 (e.g., the processing chamber component to be coated) may comprise a material sensitive to heats conducive to ALD coating. For example, some aluminum alloys may degrade over time at high temperatures. Heating elements 224 may be utilized to provide a temperature conducive to materials of inner chamber 206 (e.g., about 250° C. for aluminum).

Figure 3A:
FIGS. 3A-B depict views of exemplary chamber components and apparatus assembles for use in coating one or more surfaces of the components, according to some embodiments.
Figure 3A:
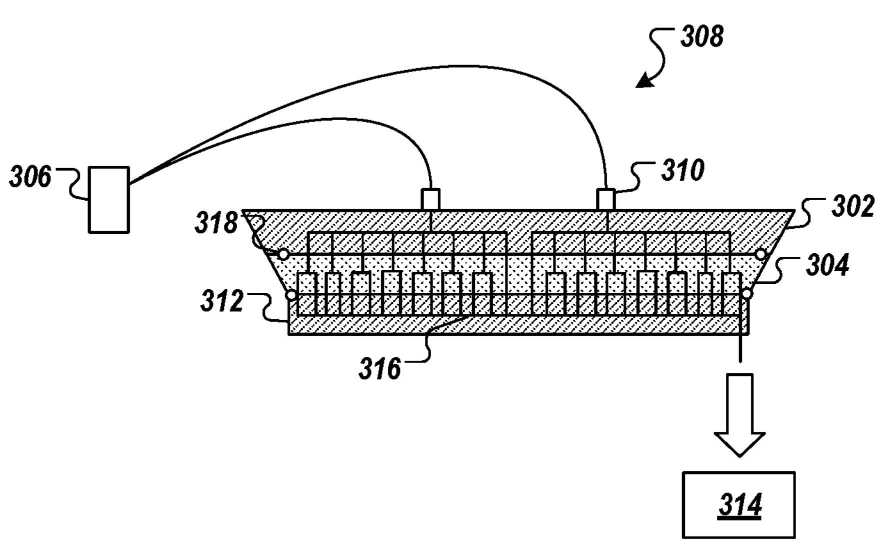
Figure 3B:
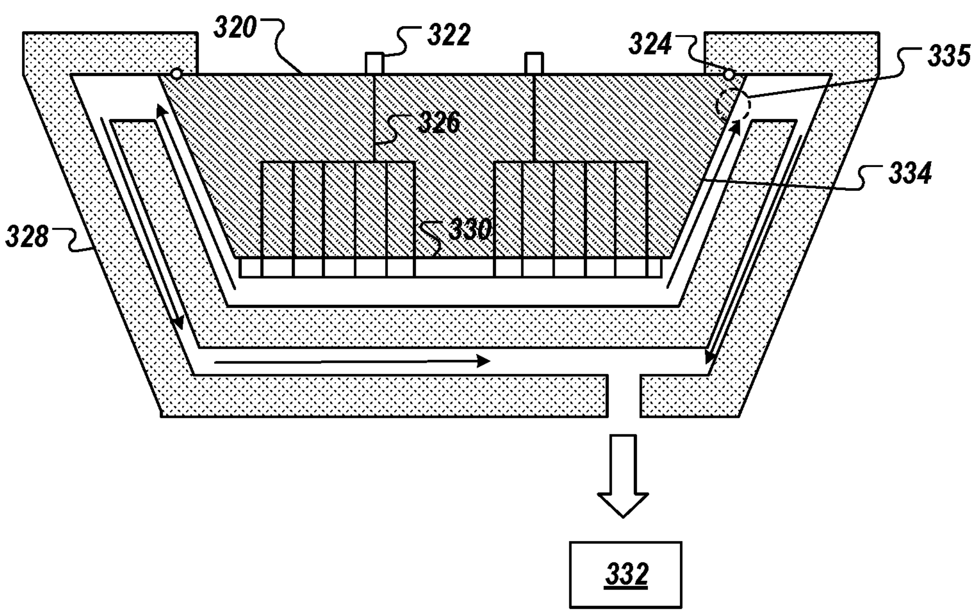

FIGS. 3A-B depict views of exemplary chamber component and apparatus assemblies for use in coating one or more surfaces of the component, according to some embodiments. FIG. 3A depicts system 300A for coating interior surfaces of a chill plate 302 and heat plate 304 (e.g., components of gas delivery system 106 of FIG. 1), according to some embodiments. System 3A includes gas handling system 306 (e.g., gas manifold 210 of FIG. 2), lines 308, and inlets 310 that interface with lines 308. In some embodiments, inlets 310 are configured to supply process gas to a chamber component (e.g., a chill plate 302 as depicted in FIG. 3, or another component such as a gas plenum, showerhead, etc.) when the chamber component is used in processing substrates. Lines 308 may be configured to interface with existing inlets 310. In some embodiments, a different configuration for supplying ALD gas to the assembly may be used, e.g., a plate, a chamber, etc.

System 300A further includes chill plate 302, heat plate 304, and exhaust plate 312, coupled to exhaust system 314. Components of system 300A (e.g., chill plate 302, heat plate 304, exhaust plate 312) may include fluid flow channels 316. System 300A may further include one or more joints 318 (e.g., O-rings, gaskets, toric seals, or the like), which may isolate the volume inside the assembly from the ambient environment (e.g., isolate inner chamber 206 from outer chamber 204 as depicted in FIG. 2). As shown in FIG. 3A, two inlets 310 couple to channels 316 which branch to a large number of channels within chill plate 302, interface with channels 316 in heat plate 304 and branch further. Channels in heat plate 304 then interface with channels 316 in exhaust plate 312, which directs fluid flow to exhaust system 314. Variations of this system are possible. For example, an inlet plate may be constructed to interface with inlets of a component to be coated (e.g., a showerhead), branching may occur in different components or to a different degree, chill plate 302 includes inlets splitting into a tree of channels directed at a region of output but other configurations, such as connected channels, channels interspersed rather than separated, etc., are possible and within the scope of this disclosure.

In some embodiments, gas handling system 306 may supply gases to the coating assembly for use in generating a resistant coating on one or more surfaces of one or more chamber components included in system 300A. Exhaust system 314 may include one or more pumps, which may act to evacuate portions of system 300A (e.g., channels 316), which may serve to enable flow of coating gases (e.g., gases containing coating precursor materials) from gas handling system 306 throughout regions of the system to be coated (e.g., the walls of channels 316). Even systems with complex internal structures (e.g., branched inner volumes) may be quickly filled with coating gas in this way (e.g., fluid flow paths may be evacuated and quickly flooded with coating gas). Repeated cycles of providing gas including one or more coating precursors and evacuating the system (e.g., channels 316) may result in growth of a corrosion resistant coating. The number of repetitions may be selected to achieve a target coating thickness.

In some embodiments, control of gas handling system 306 and/or exhaust system 314 may allow manipulation of gas flow rates, reaction rates, deposition rates, etc., in system 300A. In some embodiments, temperature control may be provided (e.g., by an outer chamber, by utilizing functionality of components of the deposition assembly such as chill plate 302, by integrating temperature control into exhaust plate 312, for example via heaters, etc.).

FIG. 3B depicts an alternate assembly design 300B for coating one or more surfaces of one or more chamber components, according to some embodiments. Assembly 300B includes chamber component stack 320. Chamber component stack 320 may include any chamber component or chamber components that are to be coated with a resistant coating (e.g., a halogen resistant coating, a corrosion resistant coating, etc.). Chamber component stack 320 may include components of a gas distribution system, e.g., a chill plate, a heat plate, a gas plenum, a showerhead, etc. Chamber component stack 320 may include inlets 322 on a first side coupled to channels 326 within chamber component stack 320. Channels 326 may further be coupled to outlets on a second side of chamber component stack 320.

Assembly 300B further includes exhaust apparatus 328. In some embodiments, portions of an exterior surface of a chamber component are to be coated with a resistant coating. For example, portions of the outside surface of a chamber component may come into contact with processing gas during semiconductor processing operations, and these areas may be targeted for coating deposition in addition to interior channels. Exhaust apparatus 328 shows one way in which this may be accomplished. Exhaust apparatus 328 is configure to direct gas flow from outlets of chamber component stack 320 along an outer surface of chamber stack 320 before being directed to exhaust system 332. Exhaust apparatus 328 may make a seal with chamber component stack 320 or another portion of a coating system (e.g., an inlet plate, if present, etc.), for example via O-rings 324. In some embodiments, only a portion of an outer surface of chamber component stack 320 is to receive a resistant coating. In some embodiments, a seal (e.g., seal defining inner chamber 206 of FIG. 2) may be made along a different portion of chamber component stack 320, e.g., at location 335 on exterior surface 334 of chamber component stack 320 (for example, if a corrosion resistant coating is to be applied to exterior surface 334 below location 335, and is not to be deposited on exterior surface 334 above location 335, exhaust apparatus 328 may be configured to generate a seal with chamber component stack 320 at location 335). In some embodiments, the surface of chamber component stack 320 adjacent to the outlets of chamber component stack 320 (e.g., the bottom surface) may be coated, and the sides may not be. Exhaust apparatus 328 may be designed to generate a seal with chamber component stack 320 such that the bottom of chamber component stack 320 is exposed to ALD gas flow but the sides are not, masking may be used to separate the sides of chamber component stack 320 from ALD gas flow, etc.

In some embodiments, assembly 300B may further include one or more masks 330. For example, portions of the exterior surface of chamber component stack 320 may not be expected to be in contact with processing gas while installed in a processing chamber. For example, chamber component stack 320 may be installed coupled to a showerhead, and the bottom surface of chamber component stack 320 may not come into contact with corrosive gas. Mask 330 may be utilized to prevent deposition of a coating onto some areas of a surface of chamber component stack 320. Masking may be used in other areas, e.g., along exterior surface 334 of chamber component stack 320.

Assembly 300B and system 300A are described as incorporating ALD gas flow by providing gas to chamber components through gas flow inlets and providing a pressure differential via an exhaust system coupled to chamber component outlets. Reversing the operation, e.g., providing gas for ALD through process gas outlets and generating a vacuum via an exhaust system coupled to process gas inlets, is also contemplated and within the scope of this disclosure.

Figure 4A:
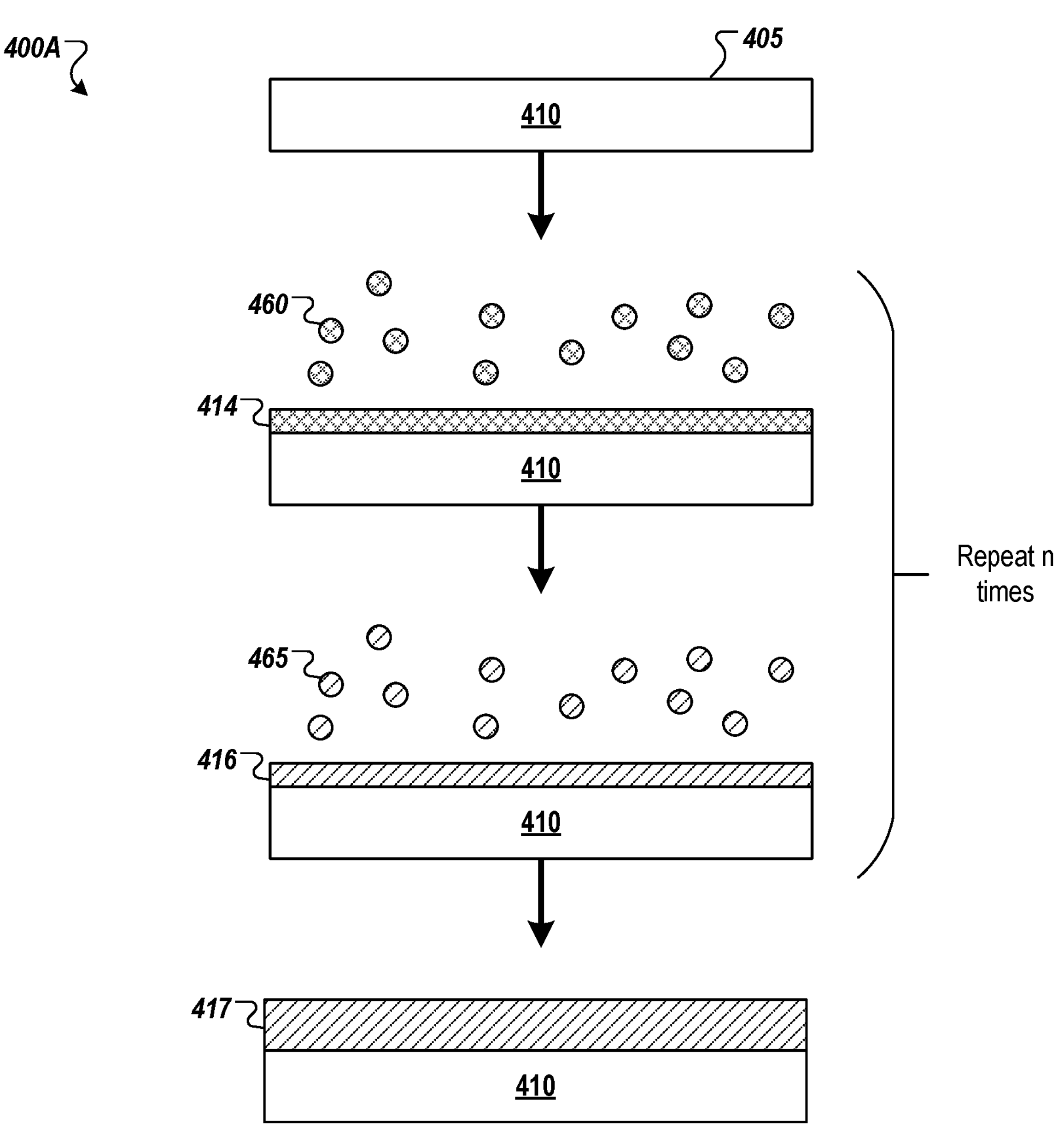
FIGS. 4A-B depict deposition processes in accordance with an ALD technique to deposit a coating on a surface of an article, according to some embodiments.
Figure 4B:
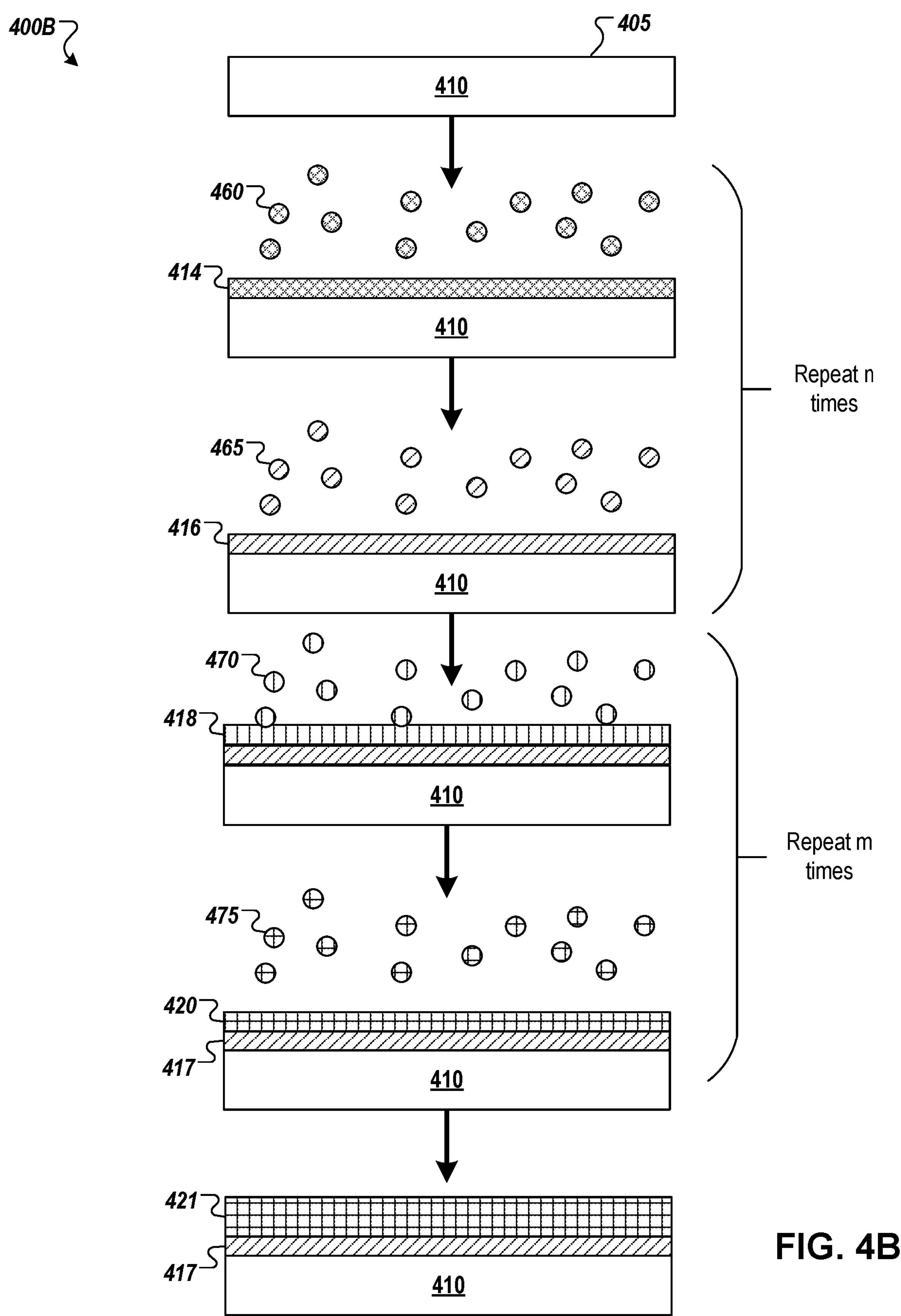

FIGS. 4A-B depict deposition processes 400A-B in accordance with an ALD technique to grow or deposit a resistant coating on a surface 205 of an article 210, according to some embodiments. Various types of ALD processes exist and the specific type utilized may be selected based on several factors such as the surface to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner.

FIG. 4A illustrates an article 410 having a first surface 405. Article 410 may represent various processing chamber components (e.g., semiconductor processing chamber components), in particular those with complex internal structure, including gas distribution system components, chill plates, heat plates, showerheads, and the like. Article 410 may be constructed from a metal (such as aluminum or stainless steel), a polymer, silicon, or any other suitable material. In one embodiment, article 410 includes a number of gas delivery components, such as a chill plate, a heat plate, and a gas plenum. In some embodiments, aluminum may be used to construct these components to generate components with a high thermal conductivity. Aluminum, however, degrades quickly in the presence of halogenated gases (e.g., fluorine, chlorine, etc.), resulting in poor performance, frequent maintenance, contaminated processing gas flow, etc.

For ALD, either adsorption of a precursor onto a surface or a reaction of a reactant with the adsorbed precursor may be referred to as a "half-reaction." During a first half reaction, a precursor is provided to a volume proximate to surface 405 of article 410 (e.g., an interior surface proximate to a fluid flow pathway) for a period of time sufficient to allow the precursor to fully adsorb onto the surface. The adsorption is self-limiting as the precursor will adsorb onto a finite number of available sites on the surface, forming a uniform continuous adsorption layer on the surface. Any sites that have already adsorbed with a precursor will become unavailable for further adsorption with the same precursor unless and/or until the adsorbed sites are subjected to a treatment that will form new available sites on the uniform continuous coating. Exemplary treatments may be plasma treatment, treatment by exposing the uniform continuous adsorption layer to radicals, or introduction of a different precursor able to react with the most recent uniform continuous layer adsorbed to the surface.

In some embodiments, two or more precursors are injected together and adsorbed onto the surface of an article. The excess precursors are pumped out until a reactant (e.g., an oxygen-containing reactant) is injected to react with the adsorbates to form a solid single phase or multi-phase layer (e.g., of YAG, of alumina, etc.). This fresh layer is ready to adsorb the precursors in the next cycle.

Article 410 may be introduced to a first precursor 460 for a first duration until surface 405 of article 410 is fully adsorbed with the first precursor 460 to form an adsorption layer 414. Subsequently, article 410 may be introduced to a first reactant 465 to react with the adsorption layer 414 to grow a solid layer 416 (e.g., so that the layer 416 is fully grown or deposited, where the terms grown and deposited may be used interchangeably herein). The first precursor 460 may be a metal precursor, which may be used for a high purity metal oxide. For example, the first precursor 460 may be an aluminum precursor such as trimethylaluminum. The first reactant 465 may include oxygen, e.g., oxygen gas, water vapor, ozone, oxygen radicals, etc., if target coating layer material is an oxide. Accordingly, the first precursor 460 and first reactant 465 (which may also be referred to as a precursor) may be used to form, for example, aluminum oxide. Accordingly, ALD may be used to form layer 416. Layer 416 may be a halogen-resistant coating, or may be one layer of a multi-layer halogen-resistant coating.

Layer 416 may include any other material that may be deposited by ALD. For example, alternate metal oxides may be deposited by providing a gas including a metal source and a gas including an oxygen source. Materials that may be deposited by ALD include rare earth metal-oxides, such as yttria ($Y_2O_3$), erbium oxide ($Er_2O_3$), zirconium oxide ($ZrO_2$), tantalum oxide ($Ta_2O_3$), etc. Layer 416 may include multiple materials, e.g., aluminum oxide and one or more rare earth oxides. Multiple materials may be co-deposited, may be applied in alternating layers, etc. In some embodiments, an oxide complex including multiple metals may be deposited, e.g., the deposited material may be of compositions such as $Y_xZr_yO_z$, $Y_aZr_xAl_yO_z$, $Y_xAl_yO_z$, $Y_xEr_yO_z$, etc. In some embodiments, ALD deposited material may include YAG ($Y_3Al_5O_{12}$), EAG ($Er_3Al_5O_{12}$), or YAM ($Y_4Al_2O_9$).

In an example where later 416 is a high purity alumina (HP-$Al_2O_3$) layer, article 410 (e.g., a component of a gas delivery system having a complex internal structure to be coated) may be introduced to a first precursor 460 (e.g., trimethylaluminum (TMA)) for a first duration until all the reactive sites on surface 405 of article 410 are consumed. The remaining first precursor 460 is flushed away, e.g., via exhaust system 216 of FIG. 2, and then a first reactant 465 of $H_2O$ is injected into volume proximate to surface 405 to start the second half cycle. A layer 416 of HP-$AL_2O_3$ is formed after $H_2O$ molecules react with the Al-containing adsorption layer created by the first half reaction.

Layer 416 may be uniform, continuous and conformal. Layer 416 may be porosity free (e.g., have a porosity of zero) or have an approximately zero porosity in embodiments (e.g., a porosity of 0% to 0.01%). Layer 416 may have a thickness of less than one atomic layer to a few atoms in some embodiments after a single ALD deposition cycle. Some metalorganic precursor molecules are large. After reacting with reactant 465, large organic ligands may be gone, leaving much smaller metal atoms. One full ALD cycle (e.g., that includes introduction of precursors 460 followed by introduction of reactants 465) may result in less than a single atomic layer. For example, an $Al_2O_3$ monolayer grown by TMA and $H_2O$ typically has a growth rate of about 0.9 Å/cycle to about 1.3 Å/cycle while the $Al_2O_3$ lattice constant is a=4.7 Å and c=13 Å (for a trigonal structure).

Multiple full ALD deposition cycles may be implemented to deposit a thicker layer 417, with each full cycle (e.g., including introducing precursor 460, flushing, introducing reactant 465, and again flushing) adding to the thickness by an additional fraction of an atom to a few atoms. As shown, up to n full cycles may be performed to grow layer 417, where n is an integer value greater than 1. In some embodiments, layer 417 may have a thickness of about 5 nm to about 5 μm. In some embodiments, layer 417 may have a thickness of about 100 nm to about 1 μm. In some embodiments, layer 417 may have a thickness of about 200 nm to about 800 nm. In some embodiments, layer 417 may have a thickness of about 300 nm to about 600 nm. In some embodiments, layer 417 may have a thickness of about 400 nm to about 500 nm, or any permutation, combination, or included ranges of the above thicknesses.

Layer 417 may provide robust halogen gas resistance and mechanical properties. Layer 417 may protect article 410 (e.g., a processing chamber component) from corrosion, enhance dielectric strength, prevent cracking, etc. Internal surfaces of high aspect ratio features, such as gas delivery system, components with a high internal volume, components with a complex internal structure, components with a large ratio of inner surface area to surface area through which gas may pass to reach the inner surface area, etc., may be coated utilizing ALD techniques with an ALD system such as that depicted in FIG. 2.

Layer 417 may be HP-$AL_2O_3$, having a purity of about 89.99% to about 99.99%, in embodiments. High purity $Al_2O_3$ is significantly more resistant to halogen-containing gases than aluminum, which has other advantageous properties for use in a gas delivery system (e.g., machinability, density, thermal conductivity, etc.). Moreover, alumina has good adhesion to aluminum based components due to common aluminum elements.

FIG. 4B describes a deposition process 400B that includes deposition layer 417 as described with reference to FIG. 4A. Deposition process 400B of FIG. 2B further includes deposition of an additional layer 421 to form a multi-layer resistant coating (e.g., corrosion resistant, plasma resistant, halogen resistant, etc.). Accordingly, after layer 417 is complete, article 410 may be introduced to an additional one or more precursors 470 for a second duration until layer 417 is fully adsorbed with the one or more additional precursors 470 to form an adsorption layer 418. Subsequently, article 410 may be introduced to a reactant 475 to react with adsorption layer 418 to grow a solid layer 420, also referred to as a second layer 420. Second layer 420 may, similar to the layer depicted in FIG. 4A, be deposited multiple times (e.g., m depositions), to generate a second layer 421 of a target thickness. Different ratios of thicknesses between layer 417 and layer 421 may generate different properties, e.g., corrosion resistance, heat resistance, mechanical strength, differences in resistance to damage due to thermal expansion, etc.

Figure 5:
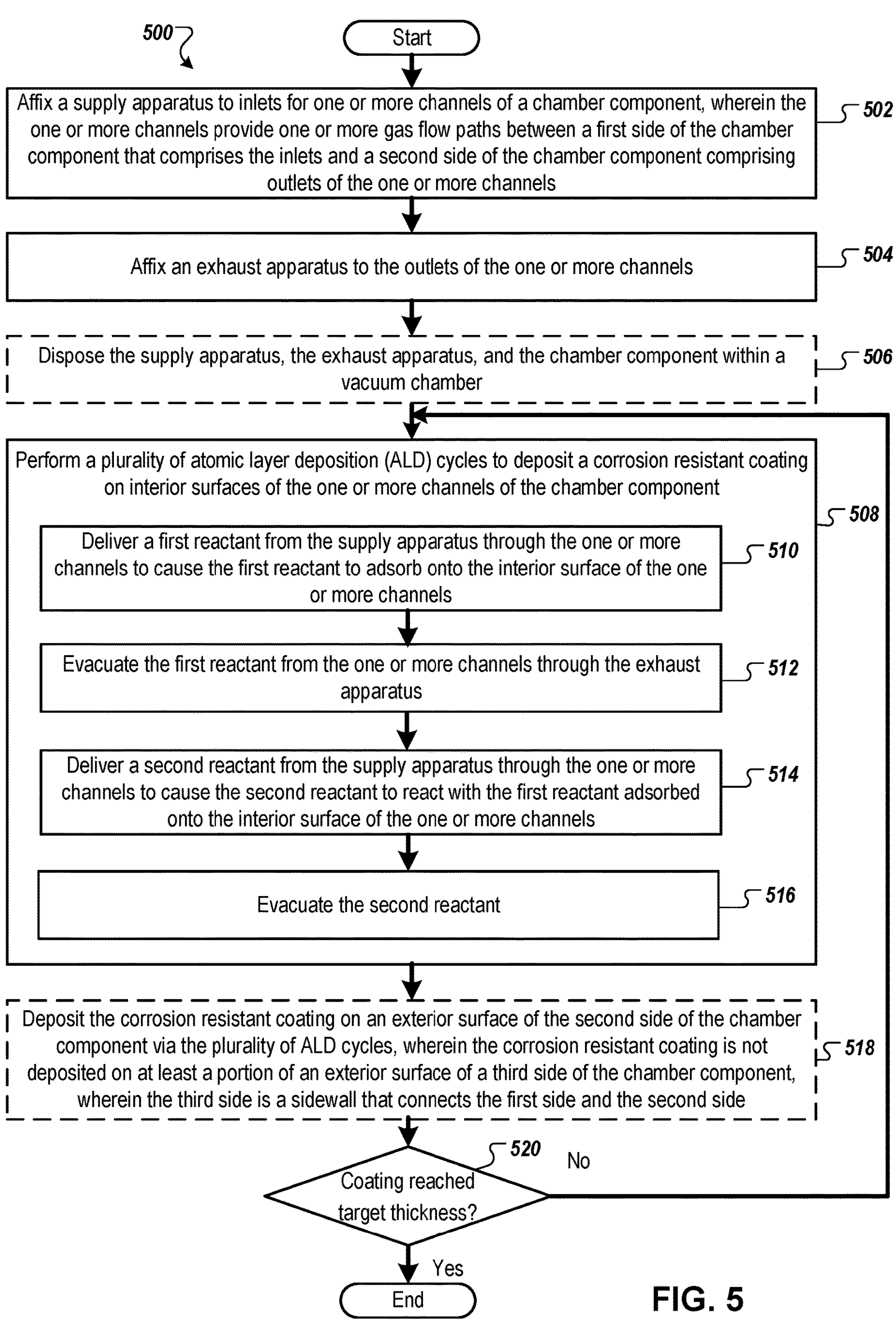
FIG. 5 is a flow diagram of a method for depositing a coating on an internal surface of a processing chamber component, according to some embodiments.

FIG. 5 is a flow diagram of a method 500 for depositing a coating on an internal surface of a processing chamber component, according to some embodiments. At block 502, a supply apparatus is affixed to inlets for one or more channels of a chamber component, e.g., a processing chamber component, a gas delivery system component, etc. The one or more channels provide one or more fluid flow paths (e.g., gas flow paths) between a first side of the chamber component and a second side of the chamber component. The first side of the chamber component comprises the inlets and the second side of the chamber component comprises one or more outlets of the one or more channels.

At block 504, an exhaust apparatus is affixed to the outlets of the one or more channels. In some embodiments, the exhaust apparatus may be designed such that it provides a path for fluid to flow from the outlets towards an exhaust system, e.g., away from the second surface of the chamber component. For example, the exhaust apparatus may include channels corresponding to the channels of the chamber component. In some embodiments, the exhaust apparatus may be configured to direct gas from channels of the chamber component to at least a portion of the exterior surface of the chamber component, e.g., the second surface, a third surface, etc. In some embodiments, the supply apparatus may instead or additionally be configured to supply fluid flow to at least a portion of the exterior surface of the chamber component.

At block 506, the supply apparatus, exhaust apparatus, and chamber component may optionally be disposed within a vacuum chamber, e.g., outer chamber 204 of FIG. 4. In some embodiments, the vacuum chamber may be utilized to contain ALD gases (e.g., gases containing ALD coating precursors). In some embodiments, the vacuum chamber may contain an inert gas. In some embodiments, the vacuum chamber may mitigate leaking of ALD gases from volumes proximate to surfaces to be coated (e.g., interior channels of a chamber component, inner chamber 206 of FIG. 2, etc.). In some embodiments, the vacuum chamber may contain an inert gas at a somewhat higher pressure than the ALD gases to mitigate leakage from the inner chamber to the outer chamber.

At block 508, a plurality of atomic layer deposition cycles are performed. The ALD cycles deposit a corrosion resistant (e.g., halogen-containing gas resistant) coating on interior surfaces of the one or more channels of the chamber component. In some embodiments, the corrosions resistant coating is or includes alumina. ALD deposition of a coating may be separated into sub-operations, described in blocks 510 through 516.

At block 510, a first reactant is delivered from the supply apparatus through the one or more channels. Delivery of the first reactant causes the first reactant to adsorb onto the interior surface of the one or more channels. The first reactant may be a precursor of a target coating material. For example, the first reactant may be an alumina precursor. In some embodiments, the first reactant may include a source of oxygen. In some embodiments, the first reactant may include a source of aluminum. Coatings of a material other than aluminum may include different and/or additional reactants, e.g., an erbium oxide coating may include an erbium source, a YAG coating may include a yttrium source, etc.

At block 512, the first reactant is evacuated from the one or more channels. The first reactant is evacuated through the exhaust apparatus. The exhaust apparatus may be configured to interface with outlets of the channels, e.g., to remove gas from the chamber component interior volume. The exhaust apparatus may be configured to draw gas through a region proximate to an exterior surface of the component, e.g. the second side, a third side, etc. In some embodiments, the third side is a sidewall that connects the first side to the second side. In some embodiments, the exhaust apparatus may be configured to allow contact between ALD gas and interior channels, to allow contact between ALD gas and both interior channels and at least a portion of the second side, to allow contact between ALD gas and both interior channels and at least a portion of the third side, to allow contact between ALD gas and at least a portion of both the second and third sides, etc. In some embodiments, a corrosion resistant coating may be applied to the walls of the channels, and to surfaces exterior to the chamber component, e.g., portions of the second and/or third sides.

At block 514, a second reactant is delivered from the supply apparatus through the one or more channels to cause the second reactant to react with the first reactant adsorbed onto the interior surface of the one or more channels. In some embodiments, the second reactant may also react with first reactant adsorbed onto an exterior surface of the one or more channels. At block 516, the second reactant is evacuated through the exhaust apparatus. Operations of blocks 514 and 516 may share features with operations of blocks 510 and 512.

At block 518, the corrosion resistant coating is optionally deposited on an exterior surface of the second side of the chamber component via the plurality of ALD cycles. The corrosion resistant coating is not deposited on at least a portion of an exterior surface of a third side of the chamber component. The third side is a sidewall that connects the first side and the second side. As discussed in connection with blocks 510 and 512, a supply and/or exhaust apparatus may be configured to provide ALD gases to target portions of a chamber component, including internal channels, external sides, portions thereof, etc.

At block 520, a determination is made regarding whether the coating deposited in the ALD process of block 508 has reached a target thickness. Thickness determination may be made in response to measuring a thickness of a coating, tracking how many cycles of block 508 have been performed, etc. If a target thickness has not been reached, operations of block 508 may be repeated. Each operation of block 508 may be referred to as an ALD cycle. In some embodiments, a target coating thickness may be between 1 nm and 5 μm. In some embodiments, many ALD cycles may be performed to achieve a coating with the target thickness, e.g., many thousands of ALD cycles. Performance of a large number of ALD cycles may be costly in terms of time spent, energy expended (e.g., energy to maintain ALD deposition temperatures), material expended, etc. Diffusion of ALD gases into complex internal geometries, e.g., internal channels in a component of a gas delivery system, may be very time consuming. Utilizing a pumping system to selectively drive flow of ALD gases in regions where a coating is to be deposited may alleviate long deposition times by providing ALD gases directly to surfaces to be coated, and directly evacuating volumes proximate to those surfaces. If a target thickness has been reached, flow of method 500 ends.

The above description is intended to be illustrative, and not restrictive. Although the present disclosure has been described with references to specific illustrative examples and embodiments, it will be recognized that the present disclosure is not limited to the examples and embodiments described. The scope of the disclosure should be determined with reference to the following claims, along with the full scope of equivalents to which the claims are entitled.

What is claimed is:

1. A system, comprising:

a first processing chamber component, comprising a first exterior side, a second exterior side, opposite the first exterior side, and one or more internal channels;

an atomic layer deposition (ALD) gas supply apparatus, wherein the ALD gas supply apparatus is affixed to inlets for the one or more internal channels of the first processing chamber component, wherein the one or more internal channels provide one or more fluid flow paths between the first exterior side of the chamber component that comprises the inlets and the second exterior side of the first processing chamber component comprising outlets of the one or more interior channels;

an exhaust apparatus, wherein the exhaust apparatus is coupled to the outlets of the one or more internal channels, wherein the one or more internal channels of the first processing chamber component, the supply apparatus, and the exhaust apparatus define an ALD gas flow path, and wherein the ALD gas flow path does not comprise the first exterior side; and a first seal between the exhaust apparatus and the second exterior side, wherein the exhaust apparatus is configured to direct the ALD gas flow path along at least a portion of the second exterior side, and wherein at least a portion of the ALD gas flow path is formed by a surface of the exhaust apparatus and the second exterior side.

2. The system of claim 1, wherein the first processing chamber component further comprises a third exterior side, comprising a sidewall that connects the first exterior side and the second exterior side, and wherein the system further comprises a second seal between the exhaust apparatus and the first processing chamber component, wherein the exhaust apparatus is configured to direct the ALD gas flow path along at least a portion of the third exterior side, and wherein at least a portion of the ALD gas flow path is formed by a surface of the exhaust apparatus and the third exterior side.

3. The system of claim 1, wherein the first processing chamber component comprises a device for delivery of processing gas to a processing chamber.

4. The system of claim 1, further comprising a vacuum chamber, wherein the first processing chamber component, the supply apparatus, and the exhaust apparatus are disposed within the vacuum chamber.

5. The system of claim 1, further comprising a mask disposed on at least a portion of the second exterior side, wherein at least a portion of the ALD gas flow path is formed by the mask and the exhaust apparatus.

6. The system of claim 1, wherein the ALD gas supply apparatus is configured to supply a source of aluminum and a source of oxygen.

7. The system of claim 1, further comprising a second processing chamber component, wherein a first surface of a fourth exterior side of the second processing chamber component is bonded to the second exterior side of the first processing chamber component such that one or more outlets of the first processing chamber component are coupled to one or more inlets of the second processing chamber component.

8. The system of claim 7, wherein the ALD gas flow path does not comprise a fifth exterior side of the second processing chamber component, opposite the fourth exterior side of the second processing chamber component.

9. The system of claim 7, further comprising a third seal between the exhaust apparatus and a fifth exterior side of the second processing chamber component disposed opposite the fourth exterior side of the second processing chamber component, wherein the exhaust apparatus is configured to direct the ALD gas flow path along at least a portion of the fifth exterior side.

10. The system of claim 7, wherein the second processing chamber component further comprises a sixth exterior side, comprising a sidewall that connects the fourth exterior side and a fifth exterior side, and wherein the ALD gas flow path comprises at least a portion of the sixth exterior side.

11. A system, comprising:

a first processing chamber component, comprising a first exterior side, a second exterior side, opposite the first exterior side, and one or more internal channels;

an atomic layer deposition (ALD) gas supply apparatus, wherein the ALD gas supply apparatus is affixed to inlets for the one or more internal channels of the first processing chamber component, wherein the one or more internal channels provide one or more fluid flow paths between the first exterior side of the chamber component that comprises the inlets and the second exterior side of the first processing chamber component comprising outlets of the one or more internal channels;

an exhaust apparatus, wherein the exhaust apparatus is coupled to the outlets of the one or more internal channels, wherein the one or more internal channels of the first processing chamber component, the supply apparatus, and the exhaust apparatus define an ALD gas flow path, and wherein the ALD gas flow path does not comprise the first exterior side; and a mask disposed on at least a portion of the second exterior side, wherein at least a portion of the ALD gas flow path is formed by the mask and the exhaust apparatus.

12. The system of claim 11, wherein the first processing chamber component further comprises a third exterior side, comprising a sidewall that connects the first exterior side and the second exterior side, and wherein the system further comprises a seal between the exhaust apparatus and the first processing chamber component, wherein the exhaust apparatus is configured to direct the ALD gas flow path along at least a portion of the third exterior side, and wherein at least a portion of the ALD gas flow path is formed by a surface of the exhaust apparatus and the third exterior side.

13. The system of claim 11, wherein the ALD gas supply apparatus is configured to supply a source of aluminum and a source of oxygen.

14. A system, comprising:

a first processing chamber component, comprising a first exterior side, a second exterior side, opposite the first exterior side, a third exterior side that comprises a sidewall connecting the first exterior side and the second exterior side, and one or more internal channels;

an atomic layer deposition (ALD) gas supply apparatus, wherein the ALD gas supply apparatus is affixed to inlets for the one or more internal channels of the first processing chamber component, wherein the one or more internal channels provide one or more fluid flow paths between the first exterior side of the chamber component that comprises the inlets and the second exterior side of the first processing chamber component comprising outlets of the one or more internal channels;

an exhaust apparatus, wherein the exhaust apparatus is coupled to the outlets of the one or more internal channels, wherein the one or more internal channels of the first processing chamber component, the supply apparatus, and the exhaust apparatus define an ALD gas flow path, and wherein the ALD gas flow path does not comprise the first exterior side; and a first seal between the exhaust apparatus and the first processing chamber component, wherein the exhaust apparatus is configured to direct the ALD gas flow path along at least a portion of the third exterior side, and wherein at least a portion of the ALD gas flow path is formed by a surface of the exhaust apparatus and the third exterior side.

15. The system of claim 14, wherein the first processing chamber component further comprises a second seal between the exhaust apparatus and the second exterior side, wherein the exhaust apparatus is configured to direct the ALD gas flow path along at least a portion of the second exterior side, and wherein at least a portion of the ALD gas flow path is formed by a surface of the exhaust apparatus and the second exterior side.

16. The system of claim 14, further comprising a second processing chamber component, wherein a first surface of a fourth exterior side of the second processing chamber component is bonded to the second exterior side of the first processing chamber component such that one or more outlets of the first processing chamber component are coupled to one or more inlets of the second processing chamber component.

17. The system of claim 16, wherein the ALD gas flow path does not comprise a fifth exterior side of the second processing chamber component, opposite the fourth exterior side of the second processing chamber component.

* * * * *